US012618867B2

(12) United States Patent
Enjalbert

(10) Patent No.: US 12,618,867 B2
(45) Date of Patent: May 5, 2026

(54) SENSOR PACKAGE WITH INTERFERENCE REDUCTION AND METHOD OF OPERATION

(71) Applicant: STMicroelectronics International N.V., Geneva (CH)

(72) Inventor: Jerome Romain Enjalbert, Tournefeuille (FR)

(73) Assignee: STMicroelectronics International N.V., Geneva (NL)

( * ) Notice: Subject to any disclaimer, the term of this patent is extended or adjusted under 35 U.S.C. 154(b) by 919 days.

(21) Appl. No.: 17/456,953

(22) Filed: Nov. 30, 2021

(65) Prior Publication Data

US 2022/0170958 A1     Jun. 2, 2022

(30) Foreign Application Priority Data

Dec. 1, 2020    (EP) ..................................... 20306473

(51) Int. Cl.
| | |
|---|---|
| *G01D 5/24* | (2006.01) |
| *G01P 15/125* | (2006.01) |
| *H01L 23/00* | (2006.01) |
| *H01L 25/16* | (2023.01) |
| *G05F 1/46* | (2006.01) |
| *H03K 3/037* | (2006.01) |

(52) U.S. Cl.
CPC ............ *G01P 15/125* (2013.01); *H01L 24/48* (2013.01); *H01L 25/16* (2013.01); *G05F 1/46* (2013.01); *H01L 2224/48145* (2013.01); *H01L 2224/48247* (2013.01); *H03K 3/037* (2013.01)

(58) Field of Classification Search
CPC ........ G01P 15/125; H01L 24/48; H01L 25/16; H01L 2224/48145; H01L 2224/48247; G05F 1/46; H03K 3/037; G01D 5/24
See application file for complete search history.

(56) References Cited

U.S. PATENT DOCUMENTS

| | | | |
|---|---|---|---|
| 6,145,384 A | 11/2000 | Ikeda et al. | |
| 7,687,298 B2 * | 3/2010 | Stratton | ................ G01L 9/0042 |
| | | | 438/18 |
| 9,312,015 B1 * | 4/2016 | Hsiung | .................... G11C 8/08 |

(Continued)

*Primary Examiner* — Catherine T. Rastovski
*Assistant Examiner* — Emma Alexander
(74) *Attorney, Agent, or Firm* — Seed Intellectual Property Law Group LLP

(57) ABSTRACT

A sensor package includes a first die having a capacitor sensor that includes an active sensing portion and a shield surrounding the active sensing portion. The sensor package further includes a second die that includes a voltage regulator configured to produce a shield voltage and a compensation circuit configured to produce a compensation signal. The voltage regulator and the compensation circuit are electrically coupled to the shield. The voltage regulator is configured to regulate the shield to the shield voltage and the compensation signal produced by the compensation circuit is configured to reduce an interference signal on the shield voltage. The compensation circuit includes one or more coupling capacitors that may be programmable capacitor arrays and calibration methodology entails selecting capacitance values for the programmable capacitor arrays that minimizes the error on an output signal of the sensor package.

19 Claims, 5 Drawing Sheets

20

(56)         References Cited

U.S. PATENT DOCUMENTS

| | | | | |
|---|---|---|---|---|
| 2009/0212093 | A1* | 8/2009 | Bentley | .............. G01L 19/0069 |
| | | | | 228/180.5 |
| 2013/0342189 | A1 | 12/2013 | Cox | |
| 2014/0374850 | A1 | 12/2014 | Chen et al. | |
| 2014/0374852 | A1 | 12/2014 | Raleigh et al. | |
| 2018/0149677 | A1* | 5/2018 | Milano | ............... G01R 15/148 |
| 2019/0063957 | A1* | 2/2019 | Moreno Galbis | ........ G01D 5/24 |

* cited by examiner

20

SENSOR PACKAGE WITH INTERFERENCE REDUCTION AND METHOD OF OPERATION

CROSS-REFERENCE TO RELATED APPLICATIONS

This application claims the priority under 35 U.S.C. § 119 of European patent application no. 20306473.8, filed on 1 Dec. 2020 the contents of which are incorporated by reference herein.

TECHNICAL FIELD OF THE INVENTION

The present invention relates generally to sensor technologies. More specifically, the present invention relates to a sensor package with enhanced robustness against interference and a method of operation.

BACKGROUND OF THE INVENTION

A capacitive sensor device, such as a Coriolis-based gyroscope transducer, an accelerometer, a pressure sensor, and the like, outputs a capacitive signal indicative of measurements or other properties of the capacitive sensor device. Subsequent signal conditioning for such devices can be more efficient by first converting the capacitance signal to an analog voltage signal, processing the analog voltage signal, and converting the analog voltage signal to a digital representation of the signal. The market demands high performance sensors with good offset stability over temperature (TCO), low noise, and low power consumption.

SUMMARY

Aspects of the disclosure are defined in the accompanying claims.

In a first aspect, there is provided a sensor package comprising a first die having a capacitive sensor, the capacitive sensor including an active sensing portion and a shield surrounding the active sensing portion, and a second die comprising a voltage regulator configured to produce a shield voltage and a compensation circuit configured to produce a compensation signal, the voltage regulator and the compensation circuit being electrically coupled to the shield, wherein the voltage regulator is configured to regulate the shield to the shield voltage, and the compensation signal produced by the compensation circuit is configured to reduce an interference signal on the shield voltage In a second aspect, there is provided in a sensor package that includes a first die and a second die, the first die having a capacitive sensor, the capacitive sensor including an active sensing portion and a shield surrounding the active sensing portion, and the second die comprising a voltage regulator and a compensation circuit electrically coupled to the shield, a method comprising providing a shield voltage from the voltage regulator to the shield to regulate the shield to the shield voltage, detecting an interference signal imposed on the shield voltage, producing a compensation signal at the compensation circuit in response to the interference signal, and providing the compensation signal from the compensation circuit to the shield to reduce an interference signal on the shield voltage.

In a third aspect, there is provided a sensor package comprising: a first die having a capacitive sensor, the capacitive sensor including an active sensing portion and a shield surrounding the active sensing portion, the first die including a first bond pad electrically connected to the shield; a second die comprising a voltage regulator configured to produce a shield voltage, a compensation circuit configured to produce a compensation signal, and a second bond pad electrically connected to the voltage regulator and the compensation circuit. The sensor package further comprises: an inter-chip bond wire electrically connecting the first and second bond pads, wherein the shield voltage is provided to the first die via the inter-chip bond wire to regulate the shield to the shield voltage; a package substrate having a package lead; and an off-chip bond wire electrically connected between a third bond pad of the second die and the package lead, wherein a communication signal is provided to the second die via the off-chip bond wire, the communication signal imposes an interference signal on the shield voltage, the compensation signal is provided to the first die via the inter-chip bond wire, and the compensation signal is configured to reduce the interference signal on the shield voltage.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

DETAILED DESCRIPTION

In overview, the present disclosure concerns a sensor package with enhanced robustness against interference from data communication and a method of operation. More particularly, the sensor package includes a compensation circuit integrated into an application specific integrated circuit (ASIC) die of the sensor package. The compensation circuit is configured to inject a compensating charge into a shield surrounding the active sensing portion that has a similar magnitude, but an opposite polarity, as an interference signal injected into the shield via package parasitics. Injection of a compensating charge similar in magnitude and opposite in polarity may achieve significant charge reduction and shield voltage stabilization. Thus, a disturbance on a shield voltage of the shield, that might otherwise corrupt an output signal from the sensor package, may be reduced for improved performance of the sensor package. The description provided below relates to a capacitive transducer in the form of a microelectromechanical systems (MEMS) capacitive accelerometer. It should be appreciated, however, that embodiments described below may be generalized to other capacitive transducers, circuits, and components, such as gyroscopes, pressure sensors, microphones, and so forth.

The instant disclosure is provided to further explain in an enabling fashion at least one embodiment in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It should be understood that the use of relational terms, if any, such as first and second, top and bottom, and the like are used solely to distinguish one from another entity or action without necessarily requiring or implying any actual such relationship or order between such entities or actions. Furthermore, some of the figures may be illustrated using various shading and/or hatching to distinguish the different elements produced within the various structural layers. These different elements within the structural layers may be produced utilizing current and upcoming microfabrication techniques of depositing, may be is utilized in the illustrations, the different elements within the structural layers may be formed out of the same material.

Figure 1:
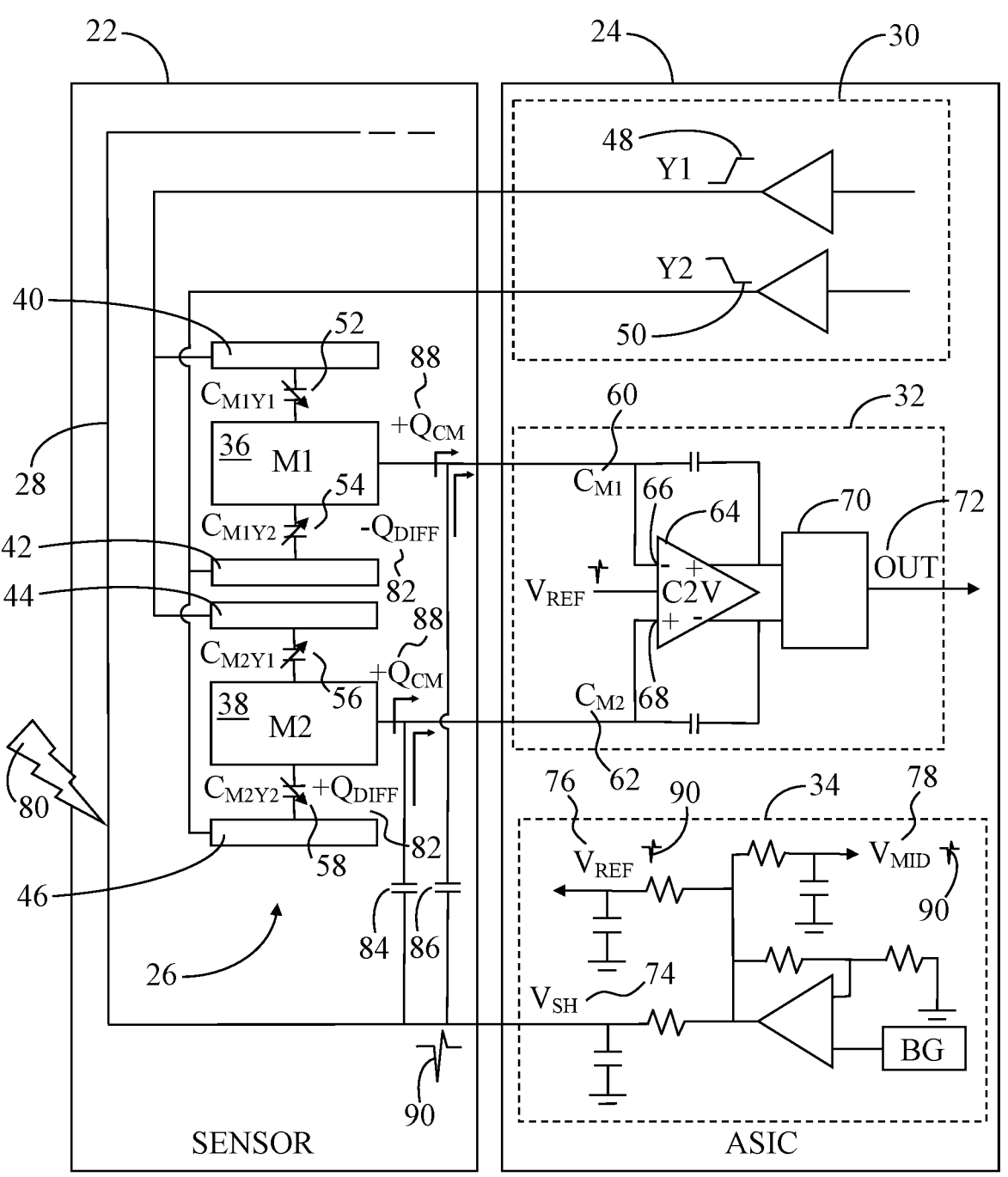
FIG. 1 shows a block diagram of a sensor package.

Referring to FIG. 1, FIG. 1 shows a block diagram of a sensor package 20. Sensor package 20 generally includes a first die, referred to herein as a sensor die 22, and a second die, referred to herein as an ASIC die 24. In the block diagram of FIG. 1, sensor die 22 and ASIC die 24 are delineated by boxes for clarity. In this example, sensor die 22 is a capacitive transducer, and more specifically, a capacitive accelerometer. As such, sensor die 22 may alternatively be referred to herein as accelerometer die 22. Sensor die 22 includes an active sensing portion 26, configured as a differential sensor, and a shield 28 at least partially surrounding active sensing portion 26. ASIC die 24 includes excitation circuitry 30, processing circuitry 32, and a voltage regulator 34, each of which are delineated by dashed line boxes.

Active sensing portion 26 of sensor die 22 includes first and second movable masses 36, 38. First and second movable masses 36, 38 may be configured to undergo motion in a direction substantially parallel to a Y-axis in a three-dimensional coordinate system in response to an acceleration force imposed on first and second movable masses 36, 38. The Y-axis may be, for example, in a vertical direction. The motion of first and second movable masses 36, 38 in response to the acceleration force can be detected as a change in capacitance between certain electrodes. By way of example, sensor die 22 includes fixed electrodes 40, 42 positioned proximate first movable mass 36 and fixed electrodes 44, 46 positioned proximate second movable mass 38. First and second movable masses 36, 38 are configured to move relative to fixed electrodes 40, 42, 44, 46 in response to an external stimulus (e.g., acceleration).

In a structure of this type, charge is injected into sensor die 22 through excitation signals 48, 50 provided by excitation circuitry 30 to enable capacitance measurement. Fixed electrodes 40, 44 receive excitation signal 48 in the form of a voltage step, labeled Y1, relative to a rest voltage. Fixed electrodes 42, 46 receive excitation signal 50 in the form of a voltage step, labeled Y2, relative to the rest voltage. In such systems, the rest voltage is typically half of the voltage between the minimum and maximum voltages. Thus, in an example, excitation signal 48 may rise from a rest level (e.g., the rest voltage) to a high level (e.g., from 0.8V to 1.6V) while excitation signal 50 drops from the rest level to a low level (e.g., from 0.8V to 0V). These voltage steps create charge transfers in the sensor capacitance. Additionally, the voltage at first and second movable masses 36, 38 is regulated to the rest voltage (e.g., 0.8V).

Parallel-plate capacitors 52, 54, 56, 58 are effectively formed between first and second movable masses 36, 38 and respective fixed electrodes 40, 42, 44, 46. When first and second movable masses 36, 38 move in response to an acceleration force, the width of the gaps between fixed electrodes 40, 42 and first movable mass 36 and the width of the gaps between fixed electrodes 44, 46 and second movable mass 38 change which in turn causes the capacitances (labeled $C_{M1Y1}$, $C_{M1Y2}$, $C_{M2Y1}$, $C_{M2Y2}$) of capacitors 52, 54, 56, 58 to change. The charges on capacitors 52, 54, 56, 58 can be collected in downstream processing circuitry 32. First and second movable masses 36, 38 move commensurate with the magnitude of the acceleration force, such that the larger the magnitude of the acceleration force, the more first and second movable masses 36, 38 will move toward an extreme position and the larger the differential charge output from sensor die 22 will be.

Sensor die 22 and ASIC die 24 are electrically coupled to convey excitation signals 48, 50 from excitation circuitry 30 to sensor die 22 and to convey the excitation results (e.g., a first capacitance 60), labeled $C_{M1}$ (as a first differential charge component), and a second capacitance 62), labeled $C_{M2}$ (as a second differential charge component), from sensor die 22 to processing circuitry 32. Processing circuitry 32 generally includes a signal chain used to process first and second capacitances 60, 62 to yield a signal representative of the acceleration force imposed upon sensor die 22. A first stage of the signal chain includes a capacitance-to-voltage converter stage 64, abbreviated C2V herein, having first and second inputs 66, 68 which receive first and second capacitances 60, 62 from sensor die 22 and converts them to a first stage analog output voltage. Subsequent processing stages in the signal chain for processing circuitry 32 are generally represented by a box 70 and may include a gain stage, a chopper circuit, and analog-to-digital processor, and so forth to produce a digital output signal 72, labeled OUT. The processing stages represented by box 70 can vary widely and are not described in detail herein for brevity.

The current market demands high performance sensors with good offset stability over temperature (TCO), low noise, and low power consumption. Differential sensor architectures may be preferred to meet the low TCO requirement. In a differential sensor architecture such as in sensor die 22, a shield structure surrounding the active sensing portion (e.g., shield 28 surrounding active sensing portion 26) is typically regulated to a constant shield voltage 74, labeled $V_{SH}$. In the illustrated example, shield voltage 74 is provided by voltage regulator 34. Voltage regulator 34 may also provide a reference voltage 76, labeled $V_{REF}$, and/or a rest voltage 78, labeled $V_{MID}$.

In differential sensor architectures, the fixed electrodes (e.g., fixed electrodes 42, 44, 46, 48) are commonly driven by excitation signals 48, 50 while first and second movable masses 36, 38 are connected to respective first and second inputs 66, 68 of C2V 64, regulated to a constant reference voltage 76. Shield voltage 74 may be equal to reference voltage 76 in order to avoid applying unwanted electrostatic forces to first and second movable masses 36, 38, which would otherwise create offset and sensitivity errors.

The low power consumption requirement imposed on sensor package 20 can cause shield voltage 74 to be susceptible to interference 80, represented by a lightning bolt in FIG. 1, resulting from parasitic capacitive coupling at the package level thereby inducing unwanted charge injection. That is, due to the low power consumption requirement, voltage regulator 34 driving shield voltage 74 has neither a very strong current capability nor a wide frequency bandwidth. As such, shield voltage 74 is susceptible to interferences from nearby electric fields.

One common source of interference on digital output sensors is data communication. Data communication may be implemented using, for example, I2C or SPI communication protocols. I2C is a synchronous, multi-master, multi-slave, packet-switched, single-ended, serial communication bus typically used for attaching lower-speed peripheral integrated circuits to processors and microcontrollers in short-distance, intra-board communication and SPI is a synchronous serial communication interface specification used for short-distance communication, primarily in embedded systems. The clock and data lines of I2C or SPI communication protocols carry high-amplitude, sharp-edge square signals which can couple to shield 28.

Sensor die 22 typically senses capacitances (e.g., $C_{M1Y1}$, $C_{M1Y2}$, $C_{M2Y1}$, $C_{M2Y2}$) according to a periodic sequence that is synchronous to an internal clock of sensor package 20. Conversely, an end-use application into which sensor package 20 is incorporated may poll sensor package 20 for data asynchronously, relative to the internal clock of sensor package 20, as the communication line clock (e.g., the clock line of the I2C or SPI communication protocol) is independent from the internal clock of sensor package 20. That is, the end-use application may poll sensor package 20 periodically, but with a period which is different from the internal clock of sensor package 20. Accordingly, there may be instances where the reading taken at the polling period falls at critical times of the sensor data acquisition sequence, which can cause measurement corruption. Communication from the end-use application (e.g., a microcontroller unit connected to sensor package) and other components of the application may also produce asynchronous interferences.

Once shield voltage 74 is disturbed by digital communication interferers, it can easily corrupt the signal change. For example, a differential signal 82, $Q_{DIFF}$, may be created by mismatch between two mass-to-shield capacitances 84, 86. Further, a large common-mode signal 88, $Q_{CM}$, may be created which can overwhelm the common-mode regulation of C2V 64. When mass-to-shield capacitances 84, 86 are not equal, a disturbance in shield voltage 74 produces different charge injections into first and second inputs 66, 68 of C2V 64. In an example, the average of two injected charges is common-mode signal 88, $Q_{CM}$. The difference between the two injected charges is $2*Q_{DIFF}$. The charge injected in first input 66 of C2V 64 is thus $Q_{CM}-Q_{DIFF}$ and the charge injected in second input 68 of C2V 64 is thus $Q_{CM}+Q_{DIFF}$. C2V 64 reacts differently to differential signal 82 and common-mode signal 88 because those charges may be handled by distinct amplifiers of C2V 64. Nevertheless, both differential signal 82 and common-mode signal 88 can cause problems.

In addition to differential signal 82 and common-mode signal 88, other voltage references may be corrupted (represented in FIG. 1 by zigzag patterns 90) as the low-power requirement dictates sharing of a single voltage regulator 34 to generate multiple voltages (e.g., shield voltage 74, reference voltage 76, rest voltage 78), including those needed by amplifiers of the signal chain of processing circuitry 32. Depending upon the amplitude of the disturbance to shield voltage 74, corruption of digital output signal 72 can range from a simple increase in noise density to a catastrophic failure (e.g., digital output signal 72 collapsing to zero regardless of the actual sensed signal value).

Figure 2:
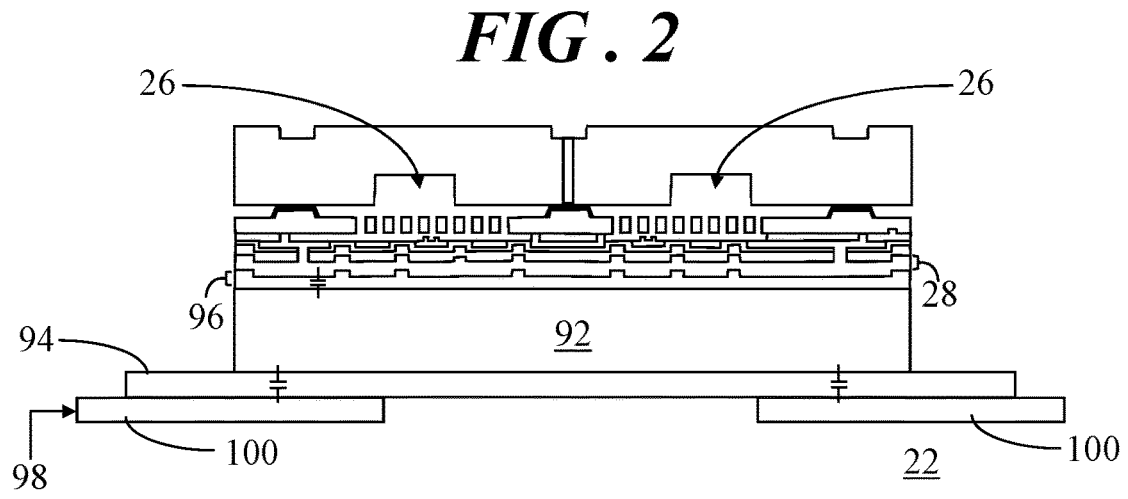
FIG. 2 shows a simplified side sectional view of a sensor die of the sensor package of FIG. 1.

FIG. 2 shows a simplified side sectional view of sensor die 22 of sensor package 20 (FIG. 1). In the side sectional view of FIG. 2, shield 28 is in the form of a polysilicon ground plane separating a floating bulk silicon 92 of sensor die 22 from active sensing portion 26 of sensor die 22.

In this architecture, bulk silicon 92 is not electrically biased by an ohmic contact. Rather, bulk silicon 92 touches nonconductive materials (e.g., a die attach film 94 at the bottom and an oxide dielectric material layer 96 interposed between bulk silicon 92 and shield 28. A direct current (DC) potential of bulk silicon 92 is undefined. However bulk silicon 92 has parasitic capacitances with neighboring conductive layers. The neighboring conductive layers can include a package substrate 98 having package leads 100, in which the parasitic capacitance is through die attach film 94. The neighboring conductive layers can also include polysilicon shield 28, in which the parasitic capacitance is through oxide dielectric material layer 96. If the neighboring conductive layers (e.g., package leads 100 and/or polysilicon shield 28) have rapid voltage changes, these changes will couple to the floating bulk silicon 92 through the parasitic capacitors. Thus, floating bulk silicon 92 may have a significant alternating current (AC) voltage. Due at least in part to a large parasitic capacitance (e.g., 55 pFarad) between bulk silicon 92 and polysilicon shield 28, the AC voltage of bulk silicon 92 can propagate readily to shield 28 with almost no attenuation.

In other architectures, bulk silicon 92 may be directly biased to shield voltage 74 (FIG. 1) by an electrical (ohmic) contact. In such an architecture, a voltage change on package leads 100 couples directly through the parasitic capacitance of die attach film 94 to the potential of shield voltage 74 of bulk silicon 92.

Figure 3:
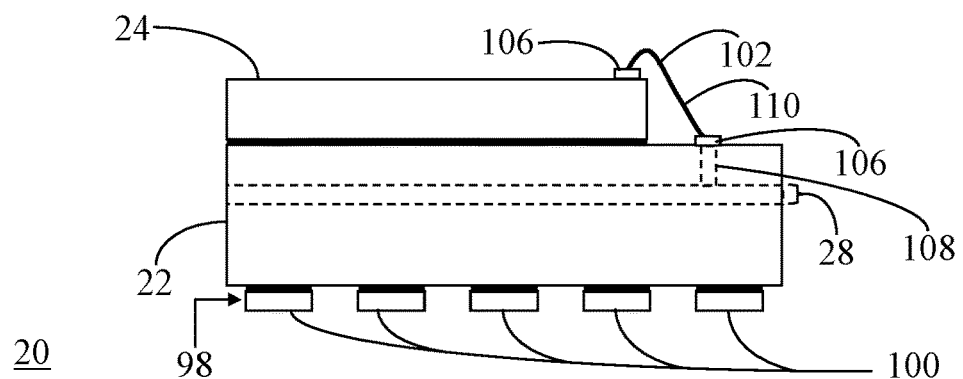
FIG. 3 shows a side view of the sensor package.
Figure 4:
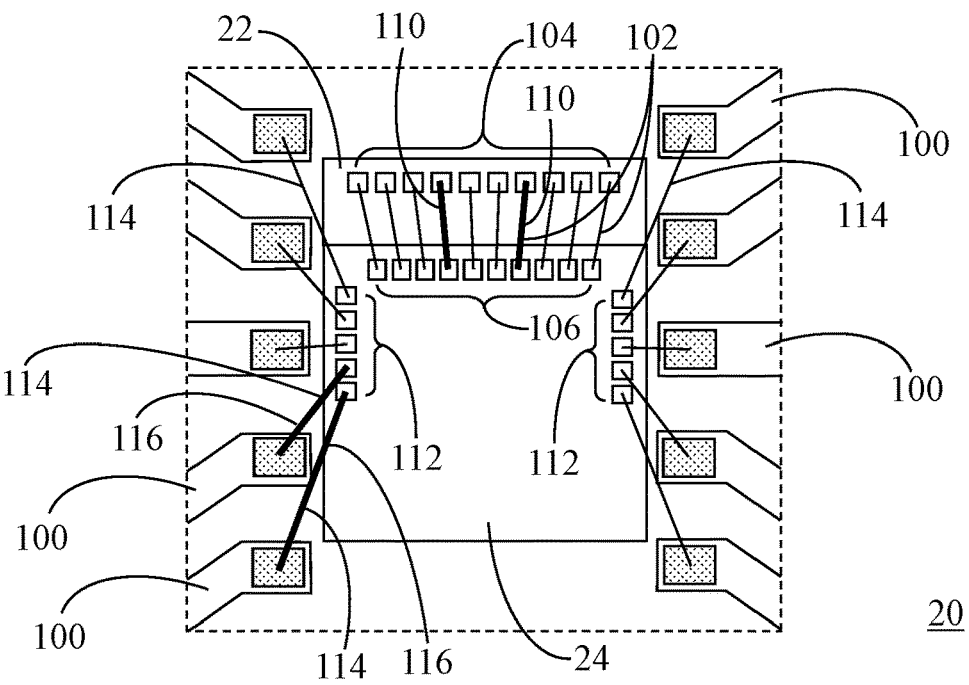
FIG. 4 shows a plan view of the sensor package.

Referring now to FIGS. 3 and 4, FIG. 3 shows a side view of sensor package 20 and FIG. 4 shows a plan view of sensor package 20. Sensor package 20 includes sensor die 22 and ASIC die 24 stacked on and coupled to sensor die 22. Inter-chip bond wires 102 suitably interconnect first bond pads 104 of sensor die 22 with second bond pads 106 of ASIC die 24. Among the various inter-chip bond wires 102, at least one of inter-chip bond wires 102 is electrically connected to shield 28. For simplicity in FIG. 3, shield 28 is represented by a dashed line box and an electrically conductive pathway or via 108, also represented by dashed lines, extends from first bond pad 104 of sensor die 22 to shield 28 to represent the electrical interconnection of first bond pad 104 to shield 28. Additionally, the one or more inter-chip bond wires 102 that interconnect first and second bond pads 104, 106 and form the electrically conductive pathway to shield 28 are referred to hereinafter as shield lines 110. Shield lines 110 are illustrated with thicker lines in FIG. 4 to distinguish them from the remaining inter-chip bond wires 102.

ASIC die 24 may further include off-chip bond pads 112. Off-chip bond wires 114 may be electrically connected between off-chip bond pads 112 and package leads 100 of package substrate 98. Among the various off-chip bond wires 114 at least one of off-chip bond wires 114 may provide a communication signal to ASIC die 24. As mentioned previously, the communication signal or signals may be clock and data lines of I2C or SPI communication protocols. Again, these digital communication signal(s) carry high-amplitude, sharp-edge square signals which can couple to shield 28. For simplicity in FIG. 4, the one or more off-chip bond wires 114 that interconnect off-chip bond pads 112 with package leads 100 and are utilized to carry the digital communication signals (e.g., clock and data signals)

are referred to hereinafter as communication lines 116. Communication lines 116 are illustrated with thicker lines in FIG. 4 to distinguish them from the remaining off-chip bond wires 110.

With regard to FIGS. 2-4, communication signals on communication lines 116 can couple to shield 28 via multiple paths, such as capacitive coupling from bond pads (e.g., first and/or second bond pads 104, 112), bond wires (e.g., shield lines 110 and/or communication lines 116), and/or package leads (e.g., package leads 100). Due to the relatively large volume of a MEMS sensor die stack that is biased or strongly coupled to shield voltage 74 (FIG. 1), parasitic capacitive coupling between shield 28 and interferers is highly likely. This parasitic capacitance may inject disturbance onto shield voltage 74 which, in turn, can corrupt sensor output signal 72 (FIG. 1). In order to alleviate the problem of injecting a disturbance to shield voltage 74, digital communication between applications and sensor package 20 may be performed synchronously and no other devices may be on the communication bus. However, this requirement severely limits the served market and the potential applications into which sensor package 20. Alternatively, it may be impractical to remove all the propagation paths leading from a disturbance on shield voltage 74 to corruption of sensor output signal 72 due to the large number and variety of propagation mechanisms. Accordingly, embodiments discussed below entail injection an opposite charge into the shield through a compensation circuit integrated into ASIC die 24 to achieve charge cancelation and stabilization of shield voltage 74.

Figure 5:
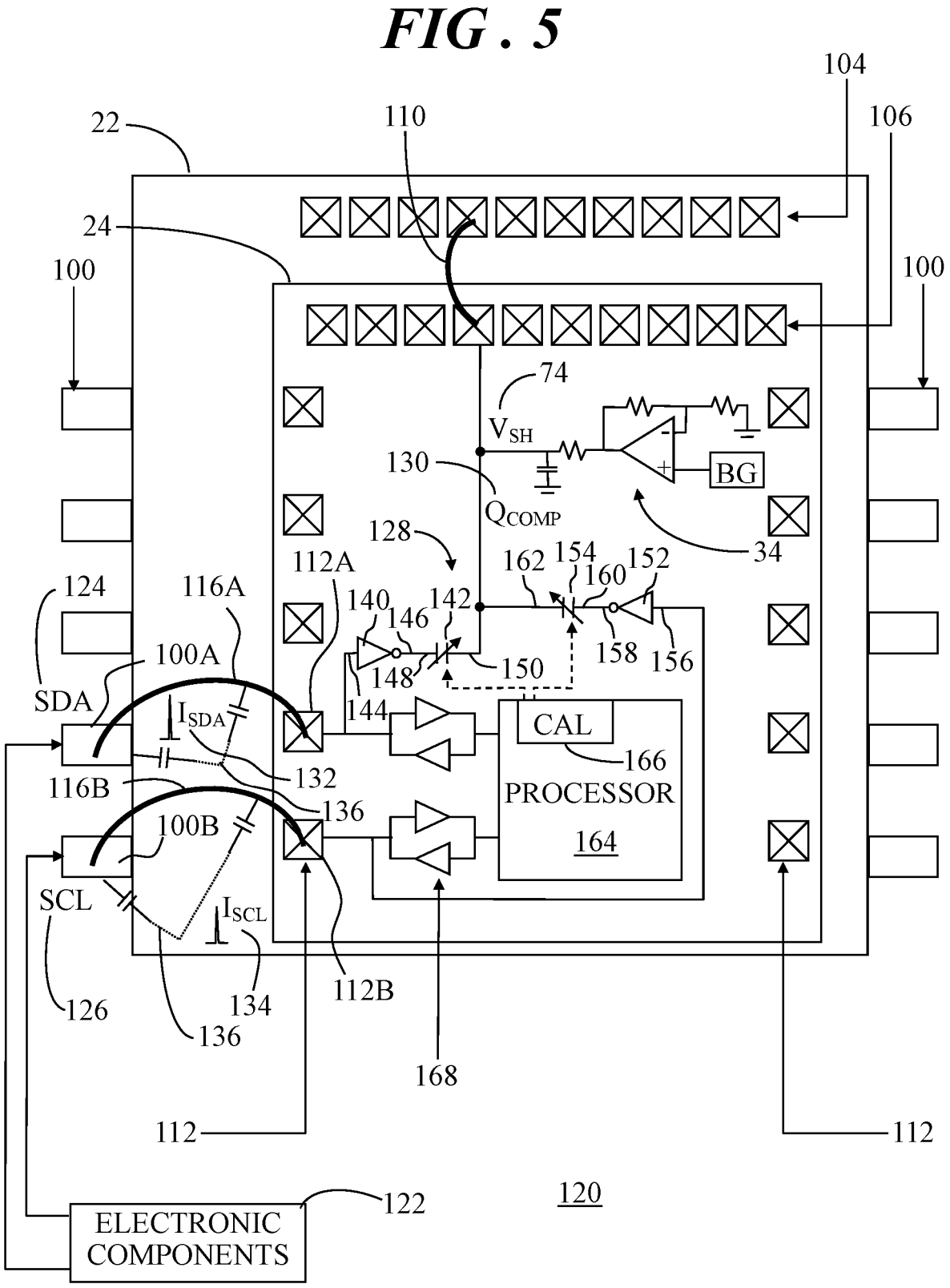
FIG. 5 shows a simplified plan view of the sensor package of FIG. 1 in accordance with an embodiment.

FIG. 5 shows a simplified plan view of a sensor package 120 in accordance with an embodiment. Sensor package 120 may be similar to sensor package 20. Therefore, features common to both of sensor packages 20, 120 will share the same reference numerals. For simplicity, reference should be made concurrently to FIGS. 1 and 5. Capacitive sensor packages 20, 120 are provided for illustrative purposes herein. It should be understood that one or more movable masses of a capacitive transducer can encompass a great variety of shapes and configurations capable of single or multiple axis sensing. Further, although a capacitive accelerometer is discussed herein, embodiments described below may be generalized to other capacitive transducers, circuits, and components, such as gyroscopes, pressure sensors, microphones, and so forth. Still further, although embodiments are discussed in connection with a differential sensor architecture in which shield 28 is connected to shield voltage 74, embodiments may alternatively be incorporated in a single-ended architecture when the shield of the singled-ended architecture is connected to a different voltage rail instead of to a system ground.

Sensor package 120 includes a first die (e.g., sensor die 22) having a capacitive sensor that includes an active sensing portion (e.g., active sensing portion 26, FIG. 1) and a shield (e.g., shield 28, FIG. 1) surrounding the active sensing portion. Additionally, sensor package 120 includes a second die (e.g., ASIC die 24) that includes a voltage regulator (e.g., voltage regulator 34) configured to produce a shield voltage (e.g., shield voltage 74). ASIC die 24 may be electrically connected to electronic components 122 (generally represented by a box) in an end-use application. Such an application may include, for example, a controller that provides one or more digital communication signals 124, 126 to ASIC die 24 via communication lines 116 of off-chip bond wires 114. In an example, communication signal 124 may be a serial data acquisition (SDA) communication signal 124 and communication signal 126 may be a serial clock (SCL) communication signal 126. Of course, other off-chip bond wires 114 connected to package leads 100 of sensor package 120 may be electrically connected to electronic components 122 (not shown herein for simplicity).

In accordance with an embodiment, a compensation circuit 128 is integrated into ASIC 24. Compensation circuit 128 is configured to produce a compensation signal 130 (e.g., a compensating charge) labeled $Q_{COMP}$. Voltage regulator 34 and compensation circuit 128 are electrically coupled to shield 28 via one or more second bond pads 106, one or more shield lines 110 of inter-chip bond wires 102, one or more first bond pads 104, and one or more conductive pathways through sensor die 22 (e.g., conductive via 108, FIG. 3). The illustrated configuration of FIG. 5 includes a single shield line 110 for simplicity. Alternative architectures may include two or more shield lines 110 electrically connected to shield 28 for redundancy.

In general, voltage regulator 34 is configured to regulate shield 28 to shield voltage 74 and compensation signal 130, produced by compensation circuit 128, is configured to reduce an interference signal 132, labeled $I_{SDA}$, and/or an interference signal 134, labeled $I_{SCL}$.

Interference signals 132, 134 represent unwanted signals coupling to shield 28 via parasitic capacitive coupling from bond pads (e.g., first and/or second bond pads 104, 112), bond wires (e.g., shield lines 110 and/or communication lines 116), and/or package leads (e.g., package leads 100) as discussed in detail above. In this example, interference signals 132, 134 may be voltage spikes resulting from, for example, logic transitions on serial data acquisition (SDA) communication line 116 from SDA communication signal 124 and/or on serial clock (SCL) communication line 116 from SCL communication signal 126. Thus, in this scenario, SDA and/or SCL communication signals 124, 126 can impose interference signals 132, 134 (e.g., disturbances) on shield voltage 74.

For clarity, package lead 100, off-chip bond pad 112, and communication line 116 providing SDA communication signal 124 to ASIC die 24 are referred to hereinafter respectively as SDA package lead 100A, SDA off-chip bond pad 112A, and SDA communication line 116A. Similarly, package lead 100, off-chip bond pad 112, and communication line 116 providing SCL communication signal 126 to ASIC die 24 are referred to hereinafter respectively as SCL package lead 100B, SCL off-chip bond pad 112B, and SCL communication line 116B. Although SDA and SCL communication signals 124, 126 are mentioned herein, any logic package lead in sensor package 120 with a large voltage swing can potentially affect shield voltage 74 and may thus benefit from compensation signal 124.

In some embodiments, compensation circuit 128 includes a first logic inverter 140 and a first coupling capacitor 142. First logic inverter 140 has a first input 144 and a first output 146, with first input 144 being electrically connected to SDA bond pad 112A. First coupling capacitor 142 has a first terminal 148 electrically connected to first output 146 of first logic inverter 140 and a second terminal 150 electrically connected to second bond pad 106 that is connected to shield line 110. Compensation circuit 128 further includes a second logic inverter 152 and a second coupling capacitor 154. Second logic inverter 152 has a second input 156 and a second output 158, with second input 156 being electrically connected to SCL bond pad 112B. Second coupling capacitor 154 has a third terminal 160 electrically connected to second output 158 of second logic inverter 152 and a fourth terminal 162 electrically connected to second bond pad 106 that is connected to shield line 110.

In operation, first logic inverter 140 is configured to receive SDA communication signal 124 at first input 144 and invert SDA communication signal 124 to produce an inverted communication signal at first output 146. First coupling capacitor 142 is configured to receive the inverted communication signal at first terminal 148. The inverted communication signal drives first coupling capacitor 142 to produce compensation signal 130 having an opposite polarity and a similar or equivalent magnitude to SDA interference signal 132. Through the electrical interconnection of compensation circuit 128 to shield 28 (FIG. 1), compensation signal 130 may therefore reduce SDA interference signal 132 on shield 28. Likewise, second logic inverter 152 is configured to receive SCL communication signal 126 at second input 156 and invert SCL communication signal 126 to produce an inverted communication signal at second output 158. Second coupling capacitor 154 is configured to receive the inverted communication signal at third terminal 160. The inverted communication signal drives second coupling capacitor 154 to produce compensation signal 130 having an opposite polarity and similar or equivalent magnitude to SCL interference signal 134. Again through the electrical interconnection of compensation circuit 128 to shield 28 (FIG. 1), compensation signal 130 may therefore reduce SCL interference signal 134 on shield 28. Accordingly, compensation circuit 128 can inject compensating charges (e.g., compensation signal 130) synchronously in response to SDA interference signal 132 and SCL interference signal 134. Further, if SDA and SCL interference signals 132, 134 are occurring simultaneously, two compensating charges will be injected simultaneously as compensation signal 130.

In some embodiments, first and second coupling capacitors 142, 154 may be fixed capacitors having a capacitance value determined during manufacture or final test. Alternatively, first and second coupling capacitors 142, 154 may be programmable capacitor arrays. A programmable capacitor array is typically configured with an array of switches each connected in series to one of an array of capacitors which in turn are connected to an input. Each switch of the array may be switched on to load a capacitor on the input of the array or switched off to remove the capacitor from the input. Thus, such programmable capacitor arrays have a variable capacitance.

In some embodiments, digital processing circuitry 164, labeled PROCESSOR, of ASIC 24 may include a calibration algorithm 166, labeled CAL, that may be executed during final test of sensor package 120 and/or periodically when sensor package 120 is operational to calibrate or otherwise set capacitance values for each of first and second coupling capacitors 142, 154 (e.g., the programmable capacitor arrays). Thus, through the execution of calibration algorithm 166, digital processing circuitry 164 may determine the capacitance values for each of first and second coupling capacitors 142, 154 for producing compensation signal 130. The calibration of first and second capacitors 142, 154 (e.g., the programmable capacitor arrays) will be discussed in detail in connection with FIG. 7.

ASIC 24 further includes logic buffers 168 interconnected between SDA off-chip bond pad 112A and digital processing circuitry 164, as well as between SCL off-chip bond pad 112B and digital processing circuitry 164. Logic buffers 168 include multiple inverters connected in series that function to preserve the sharp edges of the logic signals (e.g., SDA and SCL communication signals 124, 126) despite capacitive loading along the signal path. In the illustrated configuration, logic buffers 168 have a tri-state capability because the signal path is bi-directional. That is, SDA communication signal 124 (bits) can be transmitted from SDA package lead 100A to digital processing circuitry 164 (e.g., sensor package 120 receiving data from electronic components 122 in a first state) or from digital processing circuitry 164 to SDA package lead 100A (e.g., sensor package 120 sending data to electronic components 122 in a second state). Similarly, SCL communication signal 126 (bits) can be transmitted from SCL package lead 100B to digital processing circuitry 164 (e.g., sensor package 120 receiving a clock signal from electronic components 122 in the first state) or from digital processing circuitry 164 to SCL package lead 100B in the second state. Thus, logic buffers 168 may be inserted in both directions. However, when logic buffers 168 that are used to receive data are operating, the logic buffers used to send data must be disabled to avoid the electrical nodes(s) from being driven simultaneously to conflicting logic states (hence the third state, output in high impedance). In some embodiments, these logic buffers 168 may be used to drive state transitions at SDA and SCL off-chip bond pads 112A, 112B when executing calibration algorithm 166, as will be discussed below.

Figure 6:
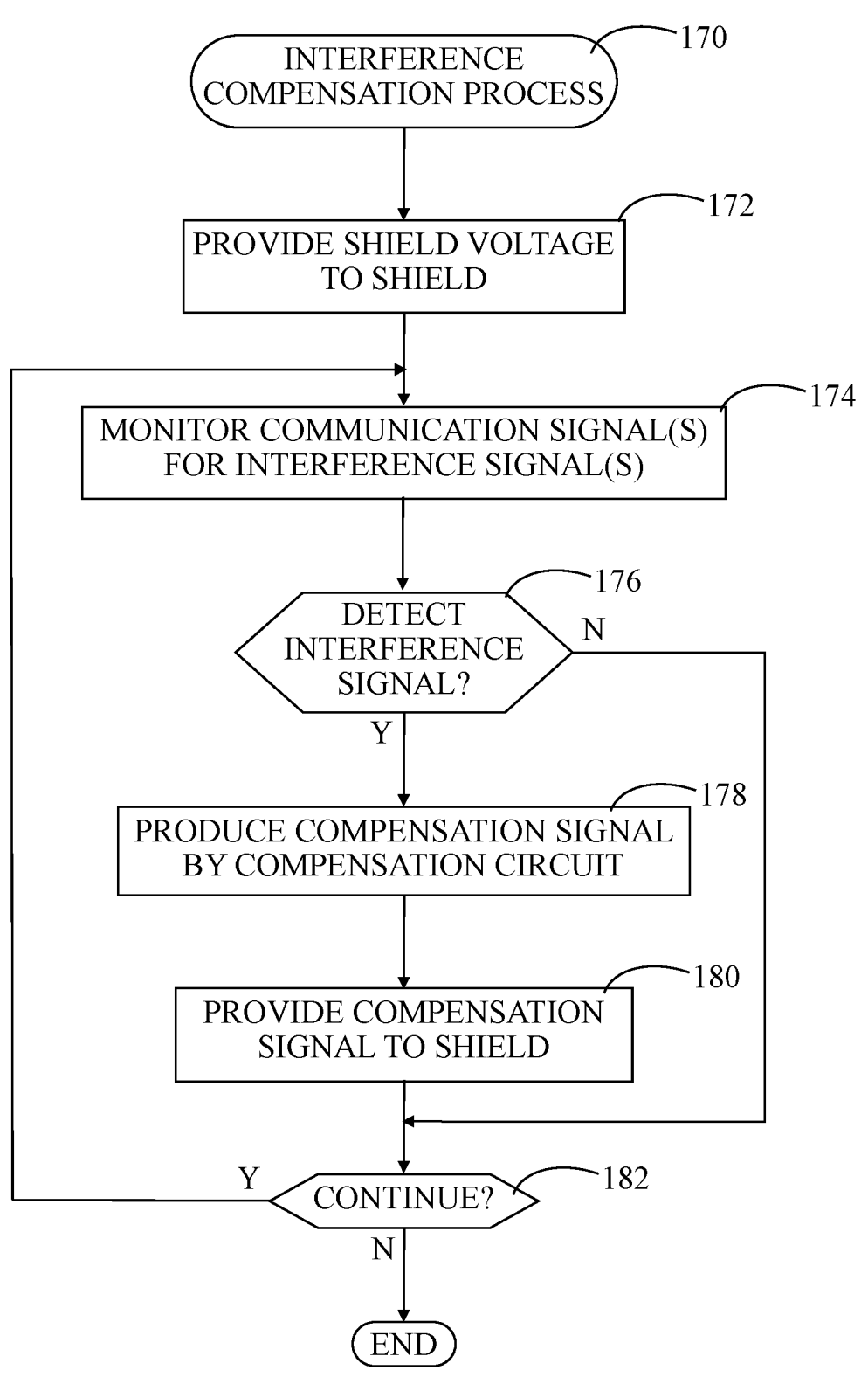
FIG. 6 shows a flowchart of an interference compensation process in accordance with another embodiment.

FIG. 6 shows a flowchart of an interference compensation process 170 in accordance with another embodiment. Interference compensation process 170 may be implemented in sensor package 120 utilizing compensation circuit 128 to compensate for disturbances on shield 28 (FIG. 1) that might otherwise corrupt the accuracy of output signal 72 (FIG. 1). Thus, FIG. 5 should be referred to concurrently with the following description of interference compensation process 170

At a block 172, activation of sensor package 120 commences and shield voltage 74 is provided to shield 28 (FIG. 1) by voltage regulator 34. At a block 174, communication signals (SDA and SCL communication signals 124, 126) are monitored for interference signals (SDA and SCL interference signals 132, 134). By way of example, first and second logic inverters 140, 152 receive and invert their respective communication signals 124, 126. SDA and SCL interference signals 132, 134 may include noise spikes (e.g., logic transitions). At a query block 176, a determination is made as to whether SDA and/or SCL interference signals 132, 134 are detected.

When either of SDA and/or SCL interference signals 132, 134 is detected at query block 176, process control continues with a block 178 where compensation signal 130 is produced by compensation circuit 128 as described above. At a block 180, compensation signal 130 is provided to shield 28. That is, compensation signal 130 is electrically communicated to second bond pad 106 of ASIC 24 that is electrically coupled to shield 28 via shield line 110, first bond pad 104 of sensor die 22, and an electrically conductive pathway represented by via 108 (FIG. 3). Following either of block 180 or when a determination is made at query block 176 that neither SDA interference signal 132 nor SCL interference signal 134 is detected, process control continues with a query block 182.

At query block 182, a determination is made as to whether interference compensation process 170 is to continue. For example, a continuation of interference compensation process 170 may occur for a total duration that sensor package 120 is activated (e.g., powered up) and a discontinuation of interference compensation process 170 may occur when sensor package 120 is deactivated (e.g., powered down). When the execution of interference compensation process 170 is to continue, process control loops back to block 174 to continue monitoring for SDA and/or SCL interference signals 132, 134. Alternatively, the execution of interference compensation process 170 ends when a determination is made that the execution of interference compensation process 170 is to be discontinued.

Figure 7:
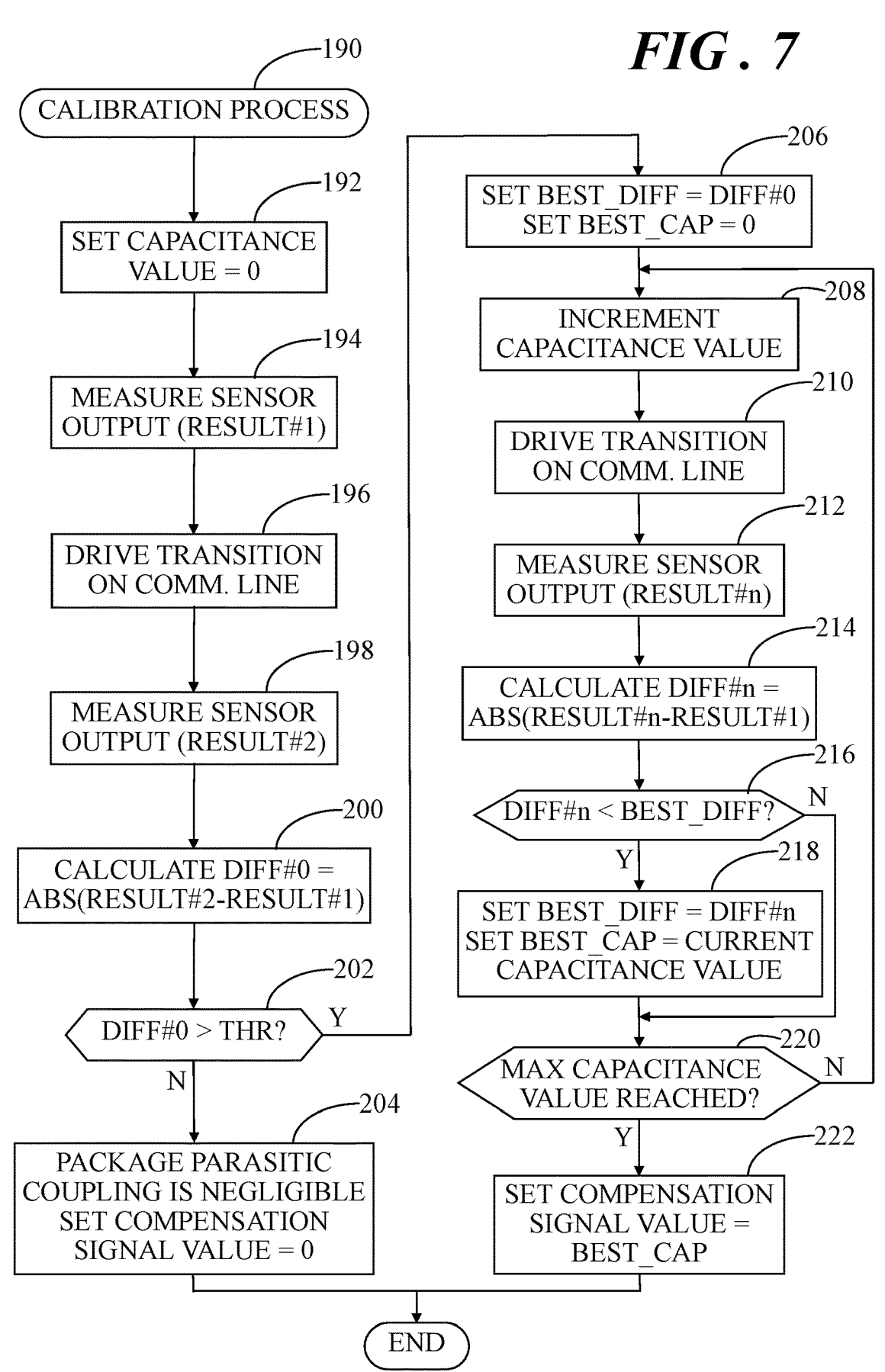
FIG. 7 shows a flowchart of a calibration process in accordance with some embodiments.

FIG. 7 shows a flowchart of a calibration process 190 in accordance with some embodiments. Calibration process 190 provides example methodology that may be performed through the execution of calibration algorithm 166 embedded in digital processing circuitry 164 of sensor package 120. Thus, FIG. 5 should be referred to concurrently with the following description of calibration process 190. When first and second coupling capacitors 142, 154 are programmable capacitor arrays, calibration process 190 enables the capacitance values of first and second coupling capacitors 142, 154 to be set to match the package parasitic capacitance resulting from interference signals 132, 134. Thus, calibration process 190 may be performed during final test of sensor package 120 and prior to execution of interference compensation process 170 (FIG. 6). Alternatively, calibration process 190 may be executed as a Built-in-Self-Test (BIST) calibration function in sensor package 120. For simplicity, calibration process 190 will be described in connection with determining a capacitance value for the programmable capacitor array represented by first coupling capacitor 142. However, the same methodology can be repeated to determine a capacitance value for the programmable capacitor array represented by second coupling capacitor 154.

Calibration process 190 relies upon the presumption that the signal acquisition sequence in an analog signal chain implemented with switched capacitor technology is especially susceptible to interferences at critical times (e.g., just before the end of a SAMPLE phase resulting in corruption of the sampled signal or just before the end of an AUTOZERO phase of an amplifier stage resulting in corruption of a sampled offset). In accordance with calibration process 190, by purposely creating a disturbance on shield voltage 74 at one of these critical times, the susceptibility of sensor package to communication noise (e.g., interference signals 132, 134) can be detected by comparing output signal 72 with and without disturbance induced on shield 28 and subsequently can be corrected by determining the proper capacitance value of the coupling capacitor (e.g., first coupling capacitor 142).

At a block 192, sensor package 120 is placed in a test mode and the capacitor value for first coupling capacitor 142 is set to zero. In response to the capacitor value being zero, at a block 194, a baseline signal output, e.g., a first output signal 72, is measured. The measured first output signal 72 is referred to herein as "RESULT#1." Next at a block 196, a transition is driven on SDA communication line 116A. That is, processing circuitry 164, via logic buffers 168 coupled to SDA off-chip bond pad 112 A, periodically drives a state transition (e.g., High-to-Low or Low-to-High) on SDA communication line 116A at a critical time of the signal acquisition sequence, which can impose SDA interference signal 132 on shield voltage 74.

At a block 198, a second output signal 72 is measured. The measured second output signal 72 is referred to herein as "RESULT#2." Since the state transition driven on SDA communication line 116A and the acquisition sequence are synchronous, the delay between them can be accurately controlled and is repeatable. Therefore, averaging can be applied to get an accurate measured second output signal 72 (e.g., RESULT#2). At a block 200, an absolute value of a difference between the first and second output signals 72 is calculated (e.g. DIFF#0=ABS(RESULT#2−RESULT#1)). This difference is referred to as an error or shift.

At a query block 202, a determination is made as to whether DIFF#0 (e.g., the error) is greater than an internal threshold (THR). When DIFF#0 is less than the threshold, a conclusion is made at a block 204 that the package parasitic coupling is negligible and the capacitance value for compensation signal 130 is set to zero. Thereafter, calibration process 190 ends or calibration process 190 may be repeated for second coupling capacitor 154, as mentioned above. However, when a determination is made that DIFF#0 is greater than the internal threshold, calibration is launched at a block 206. During calibration, the capacitance value of the programmable capacitor array represented by first coupling capacitor 142 is swept to search for the minimum error on output signal 72.

At block 206, the current best, or minimum, error (e.g., BEST_DIFF) is set equal to the current error (e.g., DIFF#0). Further, the current best capacitance value (e.g., BEST_CAP) is set equal to zero. Next, at a block 208, the capacitor value of the programmable capacitor array represented by first coupling capacitor 142 is incremented. At a block 210, a transition is again driven on SDA communication line 116A. That is, processing circuitry 164, via logic buffers 168 coupled to SDA off-chip bond pad 112 A, periodically drives a state transition (e.g., High-to-Low or Low-to-High) on SDA communication line 116A at a critical time of the signal acquisition sequence, which can impose SDA interference signal 132 on shield voltage 74. At a block 212, sensor output signal 72 is again measured. The measured output signal 72 is referred to herein as "RESULT#n." Again, averaging can be applied to get an accurate measured output signal 72 (e.g., RESULT#n). At a block 214, an absolute value of a difference between the output signals 72 is calculated (e.g. DIFF#n=ABS(RESULT#n−RESULT#1).

At a query block 216, a determination is made as to whether DIFF#n (e.g., the calculated error) is less than the current best, or minimum error (e.g., BEST_DIFF). When a determination is made at query block 216 that DIFF#n is less than the BEST_DIFF, thereby indicating that the error has been reduced, process control continues at a block 218. At block 218, the current best, or minimum, error (e.g., BEST_DIFF) is set equal to the current error (e.g., DIFF#n). Further, the current best capacitance value (e.g., BEST_CAP) is set to the current capacitor value (set at block 208). Following block 218, process control continues with a query block 220. When a determination is made at query block 216 that DIFF#n (e.g., the calculated error) is greater than the current best, or minimum, error (e.g., BEST_DIFF), process control also proceeds to query block 220.

At query block 220, a determination is made as to whether the maximum capacitance value for the programmable capacitor array, represented by first coupling capacitor 142, has been reached. When the maximum capacitance value has not been reached, process control loops back to block 208 to increment the capacitance value and repeat process blocks 210, 212, 214, 216, 218, 220 for the next capacitance value for programmable capacitor array. However, when a determination is made at query block 220 that the maximum capacitance value for the programmable capacitor array, represented by first coupling capacitor 142, has been reached calibration process 190 continues with a processing block 222.

At block 222, the compensation signal value (e.g., compensation signal 130) is set to the best capacitance value (e.g., BEST_CAP), saved at processing block 218, that produced the minimal error on the output signal 72. The capacitance value which minimized the error on output signal 72 is thus selected and can be written in memory associated with digital processing circuitry 164 for using during operation of sensor package 120. Thereafter, calibration process 190 ends or calibration process 190 may be repeated for second coupling capacitor 154, as mentioned above.

To summarize, during execution of calibration process 190 for first coupling capacitor 142, a sensor state machine periodically drives a state transition (e.g., edge) on SDA communication line 116A at a known critical time of the acquisition sequence to disturb shield voltage 74 and cause corruption of output signal 72 (FIG. 1). The state machine sweeps the values of the programmable capacitor array for first coupling capacitor 142 and monitors the error on output signal 72. Calibration process 190 ends by selecting the capacitance value for first coupling capacitor 142 which has produced the minimal error on output signal 72. Thereafter, calibration process 190 can be repeated for second coupling capacitor 154. Calibration process 190 may be executed individually for each of first and second coupling capacitors 142, 154 because the parasitic capacitance between SDA communication signal 124 and shield voltage 74 may be different from the parasitic capacitance between SCL communication signal 126 and shield voltage 74. Although calibration process 190 is discussed in connection with the calibration of first and second coupling capacitors 142, 154 associated with communication lines 116A and 116B, is should be understood that calibration process 190 may be executed in connection with other programmable capacitor arrays associated with other logic pins of a sensor package.

Thus, execution of the various processes described herein enable the utilization of a compensation circuit in a sensor package to compensate for disturbances on the shield that might otherwise corrupt the accuracy of output signal from the sensor package. Further, capacitance values can be selected to ideally minimize the error on the output signal. It should be understood that certain ones of the process blocks depicted in FIGS. 5 and 6 may be performed in parallel with each other or with performing other processes. In addition, the particular ordering of the process blocks depicted in FIGS. 5 and 6 may be modified while achieving substantially the same result. Accordingly, such modifications are intended to be included within the scope of the inventive subject matter.

Embodiments described herein entail a sensor package with enhanced robustness against interference from data communication and a method of operation. More particularly, the sensor package includes a compensation circuit integrated into an application specific integrated circuit (ASIC) die of the sensor package. The compensation circuit is configured to inject a compensating charge into a shield surrounding the active sensing portion that has a similar magnitude, but an opposite polarity, as an interference signal injected into the shield via package parasitic s. Injection of a compensating charge similar in magnitude and opposite in polarity may achieve significant charge reduction and shield voltage stabilization. Thus, a disturbance on a shield voltage of the shield, that might otherwise corrupt an output signal from the sensor package, may be reduced for improved performance of the sensor package. The embodiments described herein may be generalized to a variety of capacitive transducers, circuits, and components, such as accelerometers, gyroscopes, pressure sensors, microphones, and so forth.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

The present disclosure extends to the following lettered clauses:

A. In a sensor package (120) that includes a first die (22) and a second die (24), the first die having a capacitive sensor, the capacitive sensor including an active sensing portion (26) and a shield (28) surrounding the active sensing portion, and the second die including a voltage regulator (34) and a compensation circuit (128) electrically coupled to the shield, a method (170) comprising:

providing (172) a shield voltage (74) from the voltage regulator to the shield to regulate the shield to the shield voltage;

detecting (176) an interference signal (132) imposed on the shield voltage;

producing (178) a compensation signal (130) at the compensation circuit in response to the interference signal; and providing (180) the compensation signal from the compensation circuit to the shield to reduce the interference signal on the shield voltage.

B. The method (170) of clause A wherein the compensation signal (130) has an equivalent magnitude and opposite polarity to the interference signal (132).

C. The method (180) of clause A further comprising calibrating (190) the compensation circuit (128) to produce the compensation signal (130).

D. The method (180) of clause C wherein the calibrating operation (190) comprises:

measuring (194) a baseline signal output (72) of the capacitive sensor;

driving (210) a signal transition on a communication line (116A) of the sensor package (120), the signal transition imposing the interference signal (132) on the shield voltage (74); and determining (216) a capacitance value for a coupling capacitor (142) of the compensation circuit (128) in response to the baseline signal output and the interference signal.

E. The method (180) of clause D wherein the calibrating operation (190) further comprises:

measuring an output signal of the sensor package in response to imposition of the interference signal on the shield voltage;

comparing (216) the output signal to the baseline signal output (72) of the capacitive sensor; and the determining the capacitance value comprises selecting (218) the capacitance value for the coupling capacitor (142) that minimizes the difference between the output signal and the baseline signal output.

F. The method (180) of claim E wherein the coupling capacitor (142) comprises a programmable capacitor array, and the determining comprises:

sweeping (208, 210, 212,214, 216, 218, 220) variable capacitance values of the programmable capacitor array to select the capacitance value that minimizes the difference between the output signal and the baseline signal output; and storing (222) the selected capacitance value in a memory element (164) of the sensor package (120) for using during operation of the sensor package.

G. A sensor package (120) comprising:

a first die (22) having a capacitive sensor, the capacitive sensor including an active sensing portion (26) and a shield (28) surrounding the active sensing portion, the first die including a first bond pad (104) electrically connected to the shield;

a second die (24) comprising:

a voltage regulator (34) configured to produce a shield voltage (74);

a compensation circuit (128) configured to produce a compensation signal (130); and a second bond pad (106) electrically connected to the voltage regulator and the compensation circuit;

an inter-chip bond wire (110) electrically connecting the first and second bond pads, wherein the shield voltage is provided to the first die via the inter-chip bond wire to regulate the shield to the shield voltage;

a package substrate (98) having a package lead (100A); and an off-chip bond wire (116A) electrically connected between a third bond pad (112A) of the second die and the package lead, wherein a communication signal (124) is provided to the second die via the off-chip bond wire, the communication signal imposes an interference signal (132) on the shield voltage, the compensation signal is provided to the first die via the inter-chip bond wire, and the compensation signal is configured to reduce the interference signal on the shield voltage.

H. The sensor package (120) of clause G wherein the communication signal (124) comprises a digital communication signal from an electronic component (122) external to the sensor package.

I. The sensor package (120) of claim G wherein the compensation circuit (128) comprises:

a logic invertor (140) having an input (144) and an output (146), the input being electrically connected to the third bond pad (112A) on the second die (24); and a coupling capacitor (142) having a first terminal (148) electrically connected to the output of the logic inverter and a second terminal (150) electrically connected to the second bond pad (106).

J. The sensor package (120) of claim I wherein:

the package substrate (98) has a second package lead (100B); and the sensor package further comprises a second off-chip bond wire (116B) electrically connected between a fourth bond pad (112B) on the second die (24) and the second package lead, wherein a second communication signal (126) is provided to the second die via the second off-chip bond wire, the second communication signal imposing a second interference signal (134) on the shield voltage (74); and the compensation circuit (128) further comprises:

a second logic invertor (152) having a second input (156) and a second output (158), the second input being electrically connected to the fourth bond pad (112B) on the second die; and a second coupling capacitor (154) having a third terminal (160) electrically connected to the second output of the second logic inverter and a fourth terminal (162) electrically connected to the second bond pad (106), wherein the second coupling capacitor is configured to produce a second compensation signal (130) configured to reduce the second interference signal (134) on the shield voltage (74).

K. The sensor package (120) of claim G wherein:

the compensation circuit (128) comprises a programmable capacitor array (142) configured to provide a variable capacitance; and the second die (24) further comprises processing circuitry (164) coupled to the programmable capacitor array, the processing circuitry being configured to determine a capacitance value for the programmable capacitor array for producing the compensation signal (130).

The invention claimed is:

1. A sensor package comprising:

a first die having a capacitive sensor, the capacitive sensor including an active sensing portion having moveable masses and a shield surrounding the active sensing portion; and a second die comprising a voltage regulator configured to produce a shield voltage and a compensation circuit configured to produce a compensation signal, the voltage regulator and the compensation circuit being electrically coupled to the shield, wherein a terminal of a coupling capacitor of the compensation circuit is connected to a terminal of the voltage regulator to produce the shield voltage, and wherein the voltage regulator is configured to regulate the shield to the shield voltage, and the compensation signal produced by the compensation circuit is configured to reduce an interference signal on the shield voltage;

wherein the sensor package further comprises a package substrate having a package lead; and an off-chip bond wire is electrically connected between an off-chip bond pad on the second die and the package lead, wherein a communication signal is provided to the compensation circuit of the second die via the off-chip bond wire, the communication signal imposing the interference signal on the shield voltage, the interference signal further including a voltage which couples from the package lead of the sensor package through a parasitic capacitance and a bulk silicon of the first die to the shield which is located between the bulk silicon of the first die and the active sensing portion; wherein the communication signal is a serial data acquisition signal originating external to the sensor package or serial clock signal originating external to the sensor package, the serial data acquisition signal and serial clock signal conforming to a data communication protocol.

2. The sensor package of claim 1 wherein the compensation circuit is configured to produce the compensation signal having an equivalent magnitude and opposite polarity to the interference signal.

3. The sensor package of claim 1 wherein the communication signal comprises a digital communication signal from an electronic component external to the sensor package.

4. The sensor package of claim 1 wherein:

the sensor package further comprises an inter-chip bond wire electrically connecting first and second bond pads of the respective first and second dies, the shield voltage and the compensation signal being provided to the first die via the inter-chip bond wire; and the compensation circuit comprises:

a logic invertor having an input and an output, the input being electrically connected to the off-chip bond pad on the second die; and the coupling capacitor having a first terminal electrically connected to the output of the logic inverter and a second terminal electrically connected to the second bond pad.

5. The sensor package of claim 4 wherein:

the logic inverter is configured to receive the communication signal at the input and invert the communication signal to produce an inverted communication signal; and the coupling capacitor is configured to receive the inverted communication signal at the first terminal, the inverted communication signal driving the coupling capacitor to produce the compensation signal having an opposite polarity to the interference signal.

6. The sensor package of claim 4 wherein:

the package substrate has a second package lead; and the sensor package further comprises a second off-chip bond wire electrically connected between a second off-chip bond pad on the second die and the second package lead, wherein a second communication signal is provided to the second die via the second off-chip bond wire, the second communication signal imposing a second interference signal on the shield voltage; and the compensation circuit further comprises:

a second logic invertor having a second input and a second output, the second input being electrically connected to the second off-chip bond pad on the second die; and a second coupling capacitor having a third terminal electrically connected to the second output of the second logic inverter and a fourth terminal electrically connected to the second bond pad, wherein the second coupling capacitor is configured to produce a second compensation signal configured to reduce the second interference signal on the shield voltage.

7. The sensor package of claim 1 wherein the compensation circuit comprises a programmable capacitor array configured to provide a variable capacitance.

8. The sensor package of claim 7 wherein the second die further comprises processing circuitry coupled to the programmable capacitor array, the processing circuitry being configured to determine a capacitance value for the programmable capacitor array for producing the compensation signal.

9. A method of operating a sensor in a sensor package that includes a first die and a second die, the first die having a capacitive sensor, the capacitive sensor including an active sensing portion having moveable masses and a shield surrounding the active sensing portion, and the second die including a voltage regulator and a compensation circuit directly electrically coupled to the shield, a method comprising:

providing a shield voltage from the voltage regulator to the shield to regulate the shield to the shield voltage;

detecting an interference signal imposed on the shield voltage;

producing a compensation signal at the compensation circuit in response to the interference signal; and providing the compensation signal from the compensation circuit to the shield to reduce the interference signal on the shield voltage;

wherein an terminal of the voltage regulator is coupled to a terminal of a coupling capacitor of the compensation circuit to produce the shield voltage; and wherein an off-chip bond wire is electrically connected between an off-chip bond pad on the second die and a package lead of a package substrate, wherein a communication signal is provided to the compensation circuit of the second die via the off-chip bond wire, the communication signal imposing the interference signal on the shield voltage, the interference signal further including a voltage which couples from the package lead of the sensor package through a parasitic capacitance and a bulk silicon of the first die to the shield which is located between the bulk silicon of the first die and the active sensing portion; wherein the communication signal is a serial data acquisition signal originating external to the sensor package or serial clock signal originating external to the sensor package, the serial data acquisition signal and serial clock signal conforming to a data communication protocol.

10. The method of claim 9 wherein the compensation signal has an equivalent magnitude and opposite polarity to the interference signal.

11. The method of claim 9 further comprising calibrating the compensation circuit to produce the compensation signal.

12. The method of claim 11 wherein the calibrating operation comprises:

measuring a baseline signal output of the capacitive sensor;

driving a signal transition on a communication line of the sensor package, the signal transition imposing the interference signal on the shield voltage; and determining a capacitance value for the coupling capacitor of the compensation circuit in response to the baseline signal output and the interference signal.

13. The method of claim 12 wherein the calibrating operation further comprises:

measuring an output signal of the sensor package in response to imposition of the interference signal on the shield voltage;

comparing the output signal to the baseline signal output of the capacitive sensor; and the determining the capacitance value comprises selecting the capacitance value for the coupling capacitor that minimizes the difference between the output signal and the baseline signal output.

14. The method of claim 13 wherein the coupling capacitor comprises a programmable capacitor array, and the determining comprises:

sweeping variable capacitance values of the programmable capacitor array to select the capacitance value that minimizes the difference between the output signal and the baseline signal output; and storing the selected capacitance value in a memory element of the sensor package for using during operation of the sensor package.

15. A sensor package comprising:

a first die having a capacitive sensor, the capacitive sensor including an active sensing portion and a shield surrounding the active sensing portion, the first die including a first bond pad electrically connected to the shield;

a second die comprising:

a voltage regulator configured to produce a shield voltage;

a compensation circuit configured to produce a compensation signal, wherein a terminal of a coupling capacitor of the compensation circuit is connected to a terminal of the voltage regulator to produce the shield voltage; and a second bond pad electrically connected to the voltage regulator and the compensation circuit;

an inter-chip bond wire electrically connecting the first and second bond pads, wherein the shield voltage is provided to the first die via the inter-chip bond wire to regulate the shield to the shield voltage;

a package substrate having a package lead; and an off-chip bond wire electrically connected between a third bond pad of the second die and the package lead, wherein a communication signal is provided to the compensation circuit of the second die via the off-chip bond wire, the communication signal imposes an inter- ference signal on the shield voltage, the interference signal further including a voltage which couples from the package lead of the sensor package through a parasitic capacitance and a bulk silicon of the first die to the shield which is located between the bulk silicon of the first die and the active sensing portion, the compensation signal is provided to the first die via the inter-chip bond wire, and the compensation signal is configured to reduce the interference signal on the shield voltage;

and wherein the communication signal is a serial data acquisition signal external to the sensor package or serial clock signal originating external to the sensor package, the serial data acquisition signal and serial clock signal conforming to a data communication pro- tocol.

16. The sensor package of claim 15 wherein the commu- nication signal comprises a digital communication signal from an electronic component external to the sensor pack- age.

17. The sensor package of claim 15 wherein the compen- sation circuit comprises:

a logic invertor having an input and an output, the input being electrically connected to the third bond pad on the second die; and the coupling capacitor having a first terminal electrically connected to the output of the logic inverter and a second terminal electrically connected to the second bond pad.

18. The sensor package of claim 17 wherein:

the package substrate has a second package lead; and the sensor package further comprises a second off-chip bond wire electrically connected between a fourth bond pad on the second die and the second package lead, wherein a second communication signal is provided to the second die via the second off-chip bond wire, the second communication signal imposing a second inter- ference signal on the shield voltage; and the compensation circuit further comprises:

a second logic invertor having a second input and a second output, the second input being electrically con- nected to the fourth bond pad on the second die; and a second coupling capacitor having a third terminal elec- trically connected to the second output of the second logic inverter and a fourth terminal electrically con- nected to the second bond pad, wherein the second coupling capacitor is configured to produce a second compensation signal configured to reduce the second interference signal on the shield voltage.

19. The sensor package of claim 15 wherein:

the compensation circuit comprises a programmable capacitor array configured to provide a variable capaci- tance; and the second die further comprises processing circuitry coupled to the programmable capacitor array, the pro- cessing circuitry being configured to determine a capacitance value for the programmable capacitor array for producing the compensation signal.

* * * * *